United States Patent [19]

Kamijima

[11] Patent Number: 5,418,733
[45] Date of Patent: May 23, 1995

[54] FLOOR-PLANNING APPARATUS FOR HIERARCHICAL DESIGN OF LSI

[75] Inventor: Shinji Kamijima, Tokyo, Japan

[73] Assignee: NEC Corporation, Tokyo, Japan

[21] Appl. No.: 22,934

[22] Filed: Feb. 26, 1993

[30] Foreign Application Priority Data

Feb. 26, 1992 [JP] Japan ..................... 4-038974

[51] Int. Cl.$^6$ ............................ G06F 15/60
[52] U.S. Cl. .................. 364/490; 364/488; 364/491
[58] Field of Search .......... 364/488, 489, 490, 491, 364/468

[56] References Cited

U.S. PATENT DOCUMENTS

| | | | |
|---|---|---|---|
| 4,377,849 | 3/1983 | Finger et al. | 364/491 |
| 4,890,238 | 12/1989 | Klein et al. | 364/491 |
| 5,046,017 | 9/1991 | Yuyama et al. | 364/491 |
| 5,050,091 | 9/1991 | Rubin | 364/488 |
| 5,187,668 | 2/1993 | Okude et al. | 364/468 |
| 5,191,542 | 3/1993 | Murofushi | 364/491 |

OTHER PUBLICATIONS

L. S. Woo, et al, "Pioneer: A Macro-Based Floor-Planning Design System", VLSI Systems Design, Aug. 1986, pp. 32–43.

Primary Examiner—Kevin J. Teska
Assistant Examiner—Dan Fiul
Attorney, Agent, or Firm—Foley & Lardner

[57] ABSTRACT

A floor-planning apparatus for designing an LSI circuit including a storage unit storing logic circuit interconnection information, grouping information and macro information. A unit is provided for disposing the macro and the groups. The result of disposition is displayed on a screen and the function blocks are grouped according to the request from the exterior. A display is provided for displaying a rats net of the interconnection between the macros and also between the groups to achieve a desirable arrangement. A calculating unit is used to calculate the schematic wiring length between the macro groups and evaluate the schematic wiring length so as to replace an output side function block by a function block for high duty driving, when the length of the wiring is longer than the predetermined length, thereby reducing the time required for the LSI designing.

4 Claims, 3 Drawing Sheets

FLOOR-PLANNING APPARATUS FOR HIERARCHICAL DESIGN OF LSI

BACKGROUND OF THE INVENTION

The present invention relates to a floor-planning apparatus for use in designing a large scale integrated circuit (LSI) hierarchically.

In a conventional floor-planner used in designing LSI hierarchically, by monitoring interconnecting relationships between macros, a floor-plan has been tried out or a schematic wiring has been carried out to estimate the area of an LSI chip. In addition, a process in which functional blocks for high duty driving are used depending on the length of wiring between the macros has been carried out in designing the logic circuit prior to the planning of the floor-plan.

In the foregoing conventional process, since, prior to determining the floor-plan, the interconnection in which the wiring length between the macros will be elongated must be changed to the function block for high duty driving, there is a drawback in that the logic circuit must be designed by taking the floor-plan into account.

SUMMARY OF THE INVENTION

According to the present invention, there is provided a floor-planning apparatus for the hierarchical design of an LSI which comprises:

means for storing information regarding logic circuit interconnection of the LSI, grouping information regarding groups of the function blocks which can be functionally grouped and macro information in the hierarchical design;

means for disposing the macros and the groups by using the macro information and the grouping information;

display means for displaying the disposition of the macros and groups;

means for grouping the function blocks for each function unit according to the request from the outside;

means for displaying as a rats net the interconnecting relationship between the macros, groups and macro groups to achieve a better disposition thereof, upon receipt of the modifying direction;

means for schematically interconnecting between the macro groups after the macros and the groups have been disposed;

means for calculating the schematic wiring length between the macro groups for evaluating the wiring length of the schematic wiring; and means for replacing the function block at the output side of the macros or the macro groups connected through the wiring of which length is longer than the predetermined length by the function blocks for high duty driving to change the information regarding the logic circuit interconnection.

Thus, in the floor-planning apparatus for the hierarchical design of an LSI according to the present invention, it is possible to arrange the macros or macro groups using only the ordinary function blocks, thereby eliminating use of the function blocks for high duty driving, regardless of the length of the intermacro wiring. Therefore, the efficiency of floor-planning for the hierarchical design of LSI can be greatly increased.

DETAILED DESCRIPTION OF THE PREFERRED EMBODIMENTS

Figure 1:
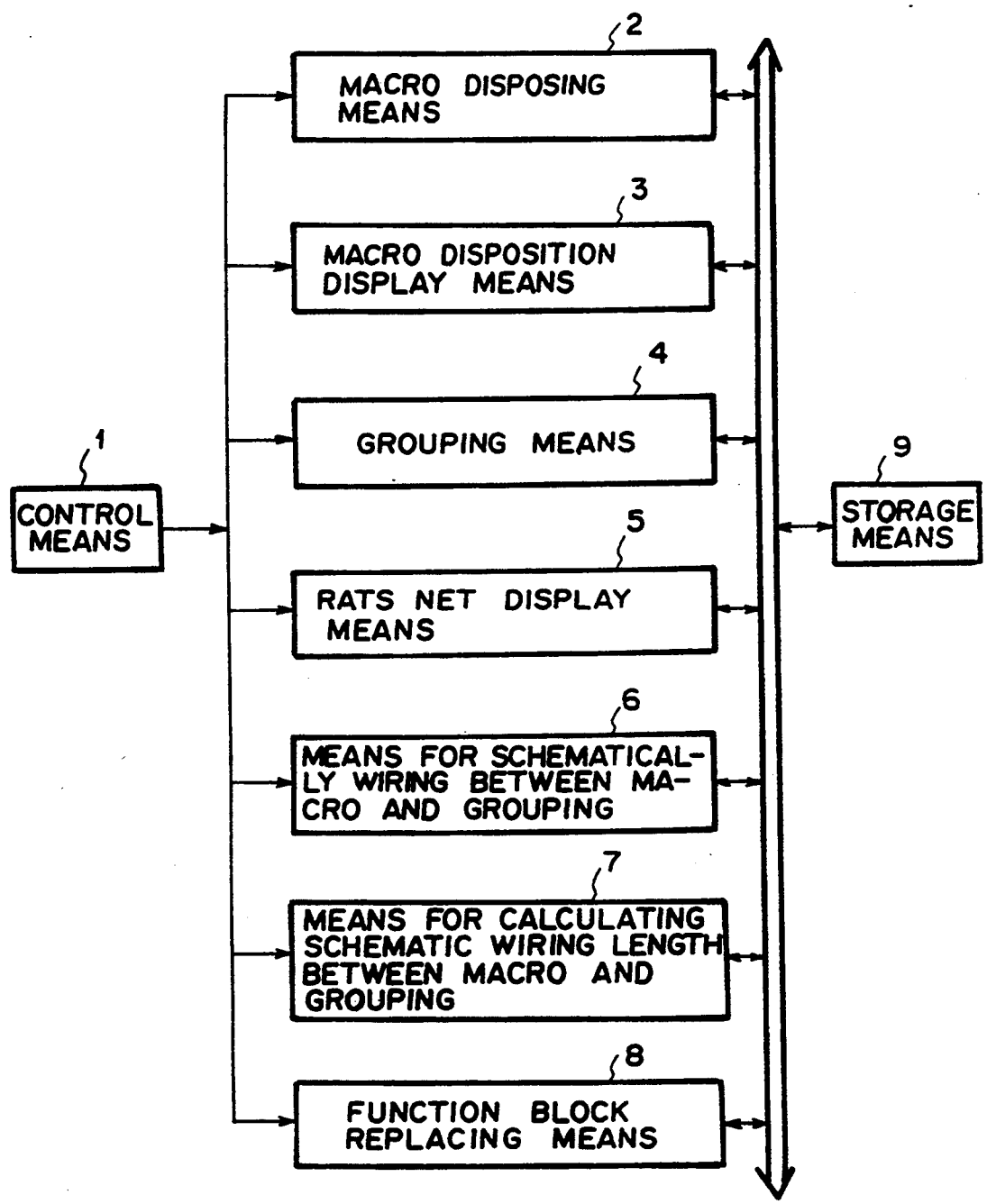
FIG. 1 is a block diagram of a floor-planning apparatus embodying the present invention.

Referring now to a specific floor-planning apparatus of the present invention with reference to the accompanying drawings, especially to FIG. 1, which shows a block diagram of a specific embodiment of the present invention.

The process carried out in the floor-planning apparatus shown in FIG. 1 includes a plurality of sequences, which are controlled by control means 1. Storage means 9 stores information regarding the logic circuit interconnection of an LSI, information regarding grouping of function blocks, which form a function unit, and macro information in the functional design.

First, by using macro disposing means 2, the macros and the groups in the grouping information are disposed. The result is displayed on a screen by means of macro disposition display means 3. The function blocks other than the macros can be arbitrarily grouped for each function unit according to the request from an exterior location by using grouping means 4. Next, the interconnecting relationship between the macros and the groups is displayed on display means 5 as a rats net so that, when displayed to the designer, a better disposition is achieved.

The term "rats net" used in this specification is intended to mean a form of display wherein the terminals of the function blocks connected to each other are displayed simply by lines, other than the actual wiring path.

After the disposition has been determined, a schematic wiring is carried out by means 7 for calculating a schematic wiring length between the macro groups, and the wiring length is evaluated by using means for calculating a schematic wiring length between the macro and the grouping. Here, for the portion where the wiring length is longer, the function block within the macro group at the output side is changed into the function blocks for high duty driving by function block changing means 8 to change the information regarding the logic circuit interconnection.

Figure 2:
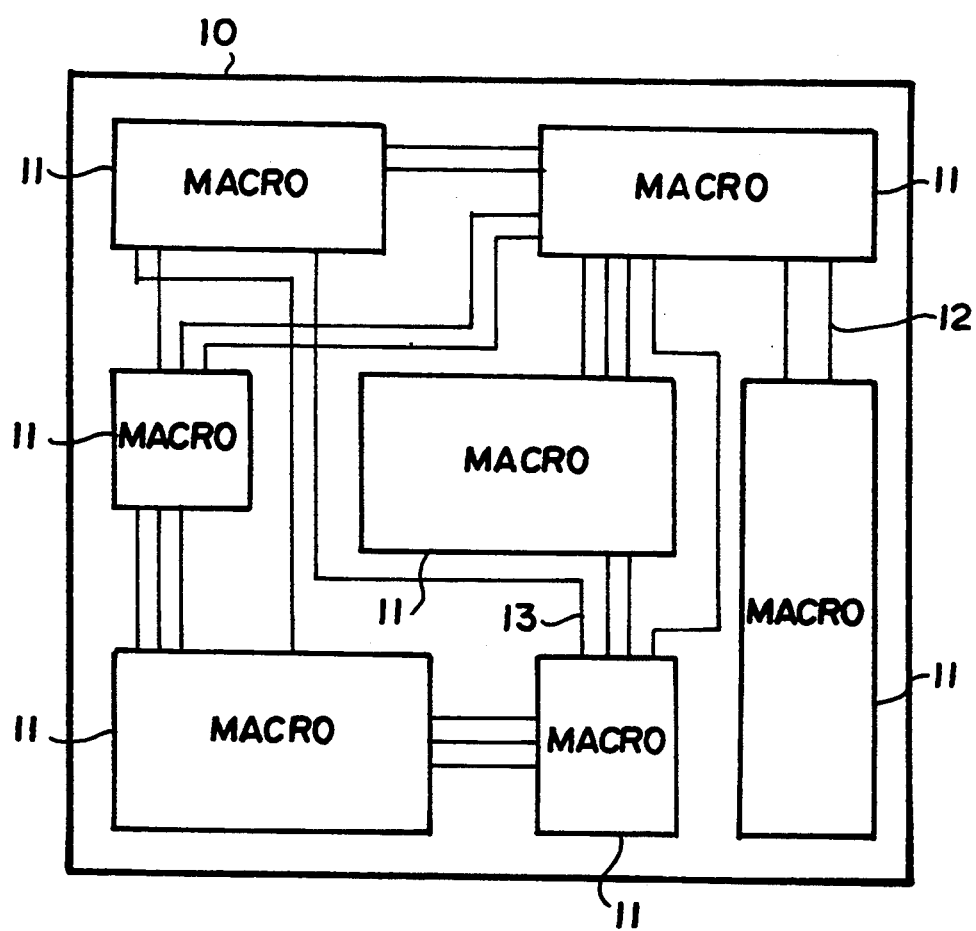
FIG. 2 is a schematic plan view illustrating an arrangement of the macros and wiring therebetween of an LSI which has been subjected to a floor-planning according to the present invention.

FIG. 2 is a specific example of how the floor-planning and the schematic wiring of the LSI are carried out by using the floor-planning apparatus of the present invention.

Within an LSI chip frame 10 are disposed a macro 11, an intermacro schematic wiring 12 and a long intermacro wiring 13, thereby to form a logic circuit comprising function blocks. All the wiring lengths between the macros are calculated.

Figure 3:
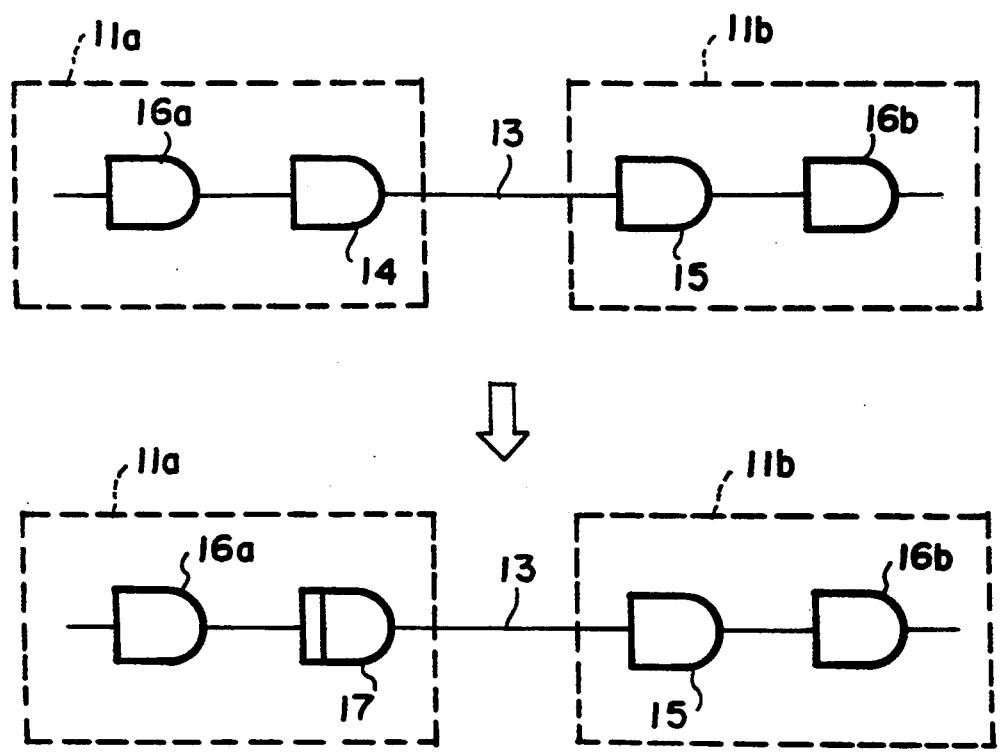
FIG. 3 shows a specific example of how the function blocks are changed according to the present invention.

In FIG. 3 is shown a pair of macros 11a and 11b connected with each other through an intermacro wiring 13. The macro 11a comprises a function block 16a and a source side function block 14, and the macro 11b a load side function block 15 and a function block 16b. The function blocks 16a, 16b may comprise logical gates such as NAND and AND gates. The wiring 13 connecting the source side function block 14 and the load side function block 15, which correspond to the border of the macros, is the intermacro wiring.

In case that the intermacro wiring is carried out schematically as in FIG. 2, if, as a result of calculating the wire length, a wiring as shown in the intermacro wiring 13, which is longer than the specified wire length, then the logic circuit information is changed to replace the source side function block 14 corresponding to the border between the macros by a function block 17 for high duty driving, as shown in FIG. 3.

Thus, even if the intermacro wiring is long, a logic circuit which does not increase the period of time for processing is arranged. At this time, the function block 17 for high duty driving, which has the same function as that of the source side function block 14 prior to being changed should be previously prepared as a library.

Thereafter, an actual layout and wiring are carried out. Since the position where it is expected that the wiring becomes longer has been changed to the function block 17 for high duty driving, as shown in FIG. 3, it becomes easy to limit to a predetermined delay time.

As described above, according to the present invention, logic circuits can be arranged using only the ordinary function blocks, without using the function blocks for high duty driving regardless of the length of the intermacro wiring, with the result that it becomes easy to design the logic circuit.

What is claimed is:

1. A floor-planning apparatus for a hierarchical design of a large scale integrated circuit (LSI) comprising:
    means for storing information regarding a logic circuit interconnection of the LSI, grouping information regarding groups of function blocks which can be functionally grouped as function units and macro information of macros used in the hierarchical design of the LSI;
    means for disposing the macros and the groups by using the macro information and the grouping information;
    display means for displaying a disposition of the macros and groups;
    means for grouping the function blocks for each function unit as macro groups according to an external request;
    means for displaying as a rats net the interconnecting relationship between the macros, groups and macro groups to achieve a better disposition thereof, upon receipt of a modifying direction;
    means for schematically interconnecting between the macro groups after the macros and the groups have been disposed;
    means for calculating a schematic wiring length between the macro groups for evaluating the wiring length of the schematic wiring; and
    means for replacing a function block at an output side of one of the macros and the macro groups connected through the schematic wiring having a length longer than a predetermined length by a function block used for high duty driving.

2. The apparatus according to claim 1 wherein the function blocks comprise logical gates.

3. The apparatus according to claim 1, wherein the function block used for high duty driving has a same function as the function block replaced.

4. A method of performing a hierarchial design of a floor plan for a large scale integrated circuit (LSI), comprising the steps of:
    holding in a memory, logic circuit interconnection data of the LSI, grouping data indicating function blocks which can be grouped and macro data of macros;
    disposing the macros and the function blocks using the grouping data and the macro data held in the memory;
    displaying the disposition of the macros and the function blocks;
    grouping the function blocks in response to an external command into function block macro groups;
    producing and displaying a rats net interconnecting relationship of the function block macro groups and the macros;
    rearranging, in response to an external command, a disposition of the function block macro groups and the macros to enhance the disposition thereof;
    schematically interconnecting the function block macro groups and the macros;
    calculating a schematic wiring length between function block macro groups; and
    replacing an output side function block of a function block macro group with a new function block having a high duty driving capacity when the output side function block has an interconnection to another element in the floor plan using a schematic wiring having a length which exceeds a predetermined length.

* * * * *